(12) United States Patent
Chen (10) Patent No.: US 10,593,853 B1
(45) Date of Patent: Mar. 17, 2020

(54) METHOD FOR BINDING MICRO DEVICE ON SUBSTRATE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/261,598

(22) Filed: Jan. 30, 2019

(51) Int. Cl.
*H01L 33/62* (2010.01)

(52) U.S. Cl.
CPC ...... *H01L 33/62* (2013.01); *H01L 2933/0066* (2013.01)

(58) Field of Classification Search
CPC ............. H01L 2924/00; H01L 2224/97; H01L 2224/29111; H01L 2224/808; H01L 2224/838; H01L 24/83; H01L 21/0206; H01L 21/31111; H01L 2224/80085; H01L 2224/80894; H01L 2224/83026; H01L 24/05; H01L 24/08; H01L 2224/83102; H01L 33/62
USPC ......................................................... 438/26
See application file for complete search history.

(56) References Cited

U.S. PATENT DOCUMENTS

| | | | | |
|---|---|---|---|---|
| 5,959,362 A | * | 9/1999 | Yoshino | H01L 21/563 257/778 |
| 2004/0219770 A1 | * | 11/2004 | Kimino | H01L 21/288 438/584 |
| 2009/0023243 A1 | * | 1/2009 | Koyanagi | H01L 21/6836 438/107 |
| 2014/0283982 A1 | * | 9/2014 | Pan | C09J 5/02 156/219 |
| 2018/0272391 A1 | * | 9/2018 | Sakurai | H01L 21/67028 |
| 2019/0252350 A1 | * | 8/2019 | Schwarz | B65G 47/90 |

* cited by examiner

*Primary Examiner* — Duy T Nguyen
(74) *Attorney, Agent, or Firm* — CKC & Partners Co., LLC (57) ABSTRACT

A method for binding a micro device on a substrate is provided. The method includes forming a conductive pad on the substrate; forming an elevated bonding layer on the conductive pad; lowering a temperature of the elevated bonding layer in an environment comprising a vapor such that at least a portion of the vapor is condensed to form a liquid layer on the elevated bonding layer; disposing the micro device over the elevated bonding layer such that the micro device is in contact with the liquid layer and is gripped by a capillary force produced by the liquid layer between the micro device and the elevated bonding layer, wherein the micro device comprises an electrode facing the elevated bonding layer; and evaporating the liquid layer such that the electrode is bound to the elevated bonding layer and is in electrical connection with the conductive pad.

15 Claims, 9 Drawing Sheets

METHOD FOR BINDING MICRO DEVICE ON SUBSTRATE

BACKGROUND

Field of Invention

The present disclosure relates to a method for binding a micro device on a substrate.

Description of Related Art

The statements in this section merely provide background information related to the present disclosure and do not necessarily constitute prior art.

In recent years, micro devices have become popular in various applications. Among all technical aspects of micro devices, the transfer process is one of the most challenging tasks for micro devices to be commercialized. One of the important issues of the transfer process is bonding the micro devices to a substrate.

SUMMARY

According to some embodiments of the present disclosure, a method for binding a micro device on a substrate is provided. The method includes forming a conductive pad on the substrate; forming an elevated bonding layer on the conductive pad; adjusting a temperature of the elevated bonding layer to a selected temperature point in an environment comprising a vapor or showering a gas on the elevated bonding layer such that at least a portion of the vapor or the gas is condensed to form a liquid layer on the elevated bonding layer; disposing the micro device over the elevated bonding layer such that the micro device is in contact with the liquid layer and is gripped by a capillary force produced by the liquid layer between the micro device and the elevated bonding layer, in which the micro device comprises an electrode facing the elevated bonding layer; and evaporating the liquid layer such that the electrode is bound to the elevated bonding layer and is in electrical connection with the conductive pad.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded/bound "to" another layer may be directly in contact with the other layer or may have one or more intervening layers. One layer "between" layers may be directly in contact with the layers or may have one or more intervening layers.

Although most of terms described in the following disclosure use singular nouns, said terms may also be plural in accordance with figures or practical applications.

Figure 1:
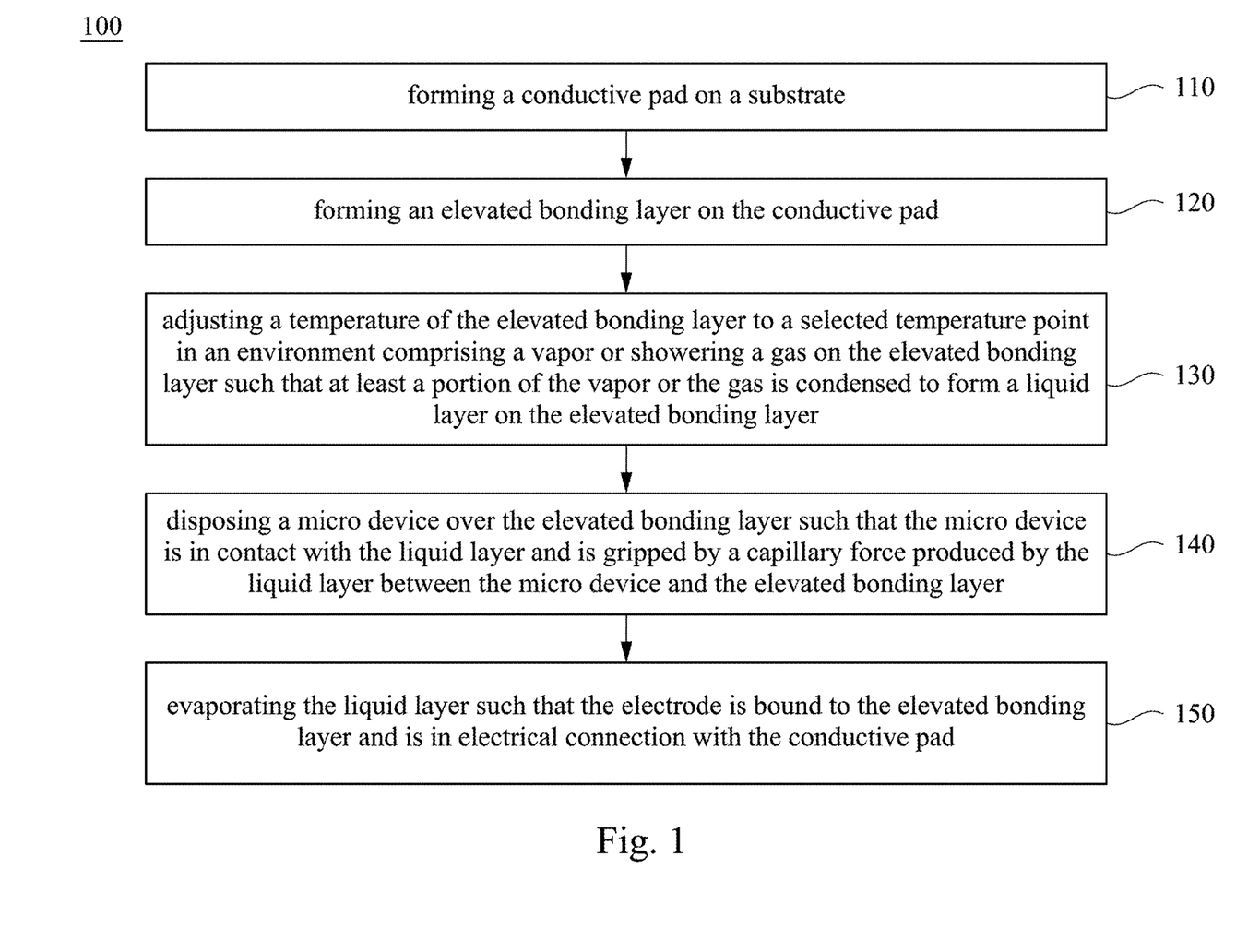
FIG. 1 is a flow chart of a method for binding a micro device on a substrate according to some embodiments of the present disclosure.

Reference is made to FIG. 1 and FIGS. 2A to 2E. FIG. 1 is a flow chart of a method 100 for binding a micro device on a substrate according to some embodiments of the present disclosure. FIGS. 2A to 2E are schematic cross-sectional views of different intermediate stages of the method 100 of FIG. 1. The method 100 begins with an operation 110 in which a conductive pad 220 is formed on a substrate 210 (referred to FIG. 2A). The method 100 continues with an operation 120 in which an elevated bonding layer 230 is formed on the conductive pad 220 (referred to FIG. 2B). The method 100 continues with an operation 130 in which a temperature of the elevated bonding layer 230 is adjusted to a selected temperature point in an environment including a vapor or a gas is showered on the elevated bonding layer 230 such that a liquid layer 240 is formed on the elevated bonding layer 230 (referred to FIG. 2C). The method 100 continues with an operation 140 in which the micro device 250 is disposed over the elevated bonding layer 230 such that the micro device 250 is in contact with the liquid layer 240 (referred to FIG. 2D). The method continues with an operation 150 in which the liquid layer 240 is evaporated such that the micro device 250 is bound to the elevated bonding layer 230 and is in electrical connection with the conductive pad 220 (referred to FIG. 2E).

Figure 2A:
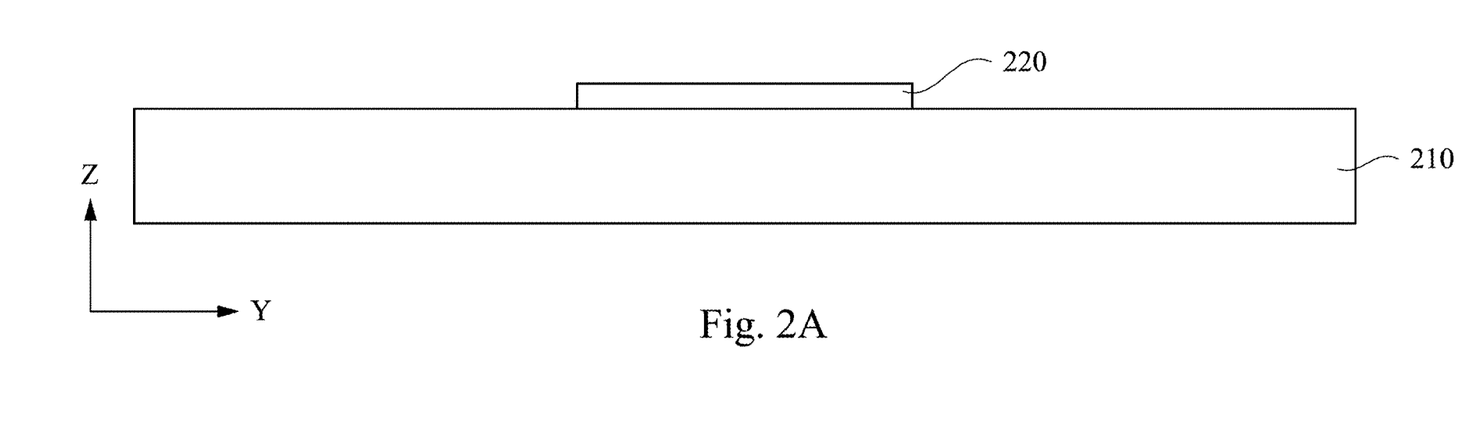
FIG. 2A is a schematic cross-sectional view of an intermediate stage of binding the micro device on the substrate according to some embodiments of the present disclosure.
Figure 2B:
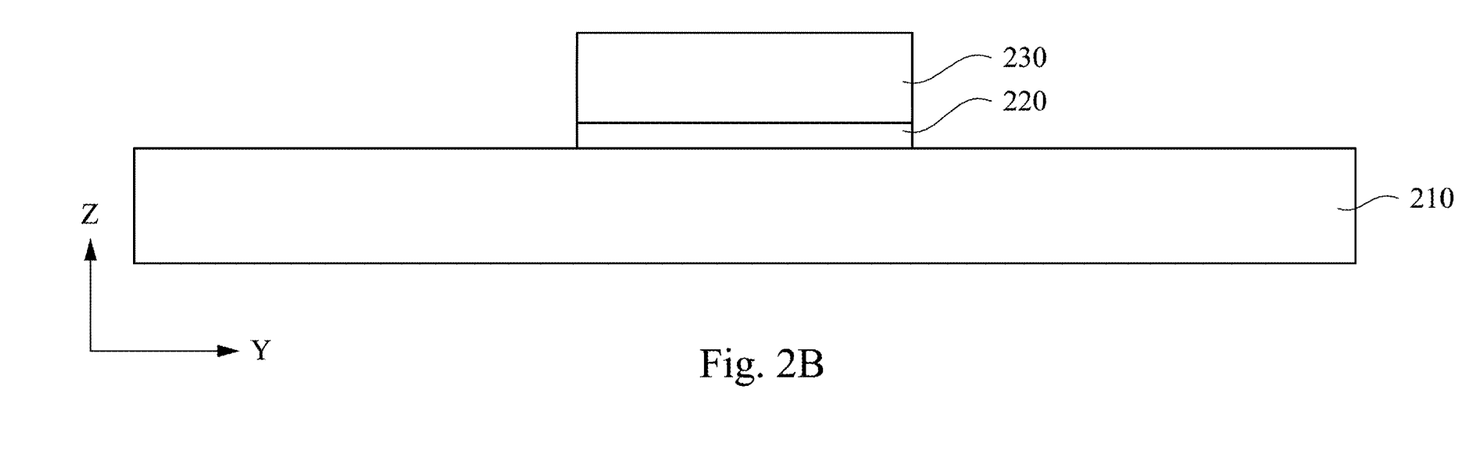
FIG. 2B is a schematic cross-sectional view of an intermediate stage of binding the micro device on the substrate according to some embodiments of the present disclosure.

Reference is made to FIGS. 2A and 2B in which the conductive pad 220 is formed on the substrate 210 and the elevated bonding layer 230 is formed on the conductive pad 220. In some embodiments, the conductive pad 220 may include copper (Cu), but should not be limited thereto. In some embodiments, the elevated bonding layer 230 includes tin (Sn). In some embodiments, a thickness of the elevated bonding layer is in a range from about 1 μm to about 10 μm. The thickness is measured parallel to a Z direction which is perpendicular to an extension direction of the substrate 210 (i.e., a Y direction).

Figure 2C:
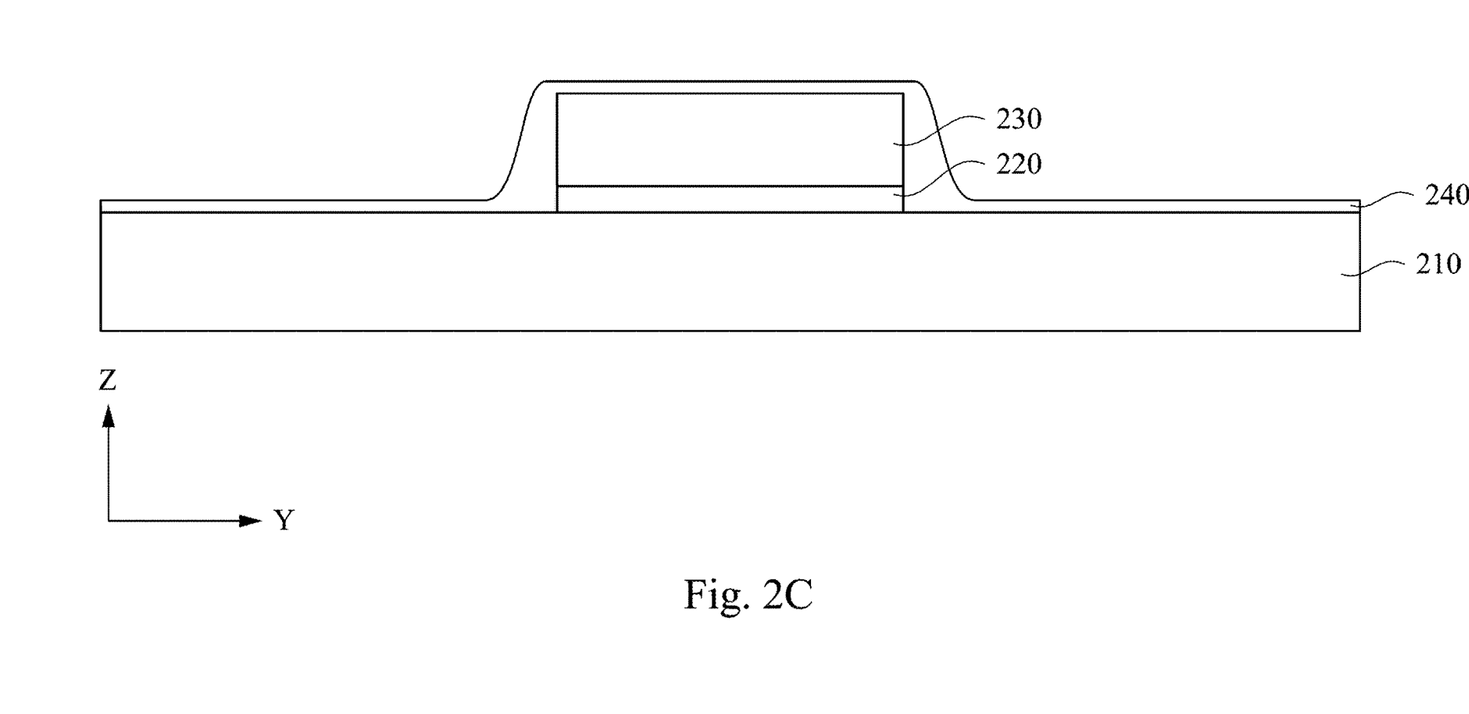
FIG. 2C is a schematic cross-sectional view of an intermediate stage of binding the micro device on the substrate according to some embodiments of the present disclosure.

Reference is made to FIG. 2C in which the liquid layer 240 is formed on the elevated bonding layer 230. In some embodiments, the liquid layer 240 includes water, but should not be limited thereto. In some embodiments, the selected temperature point is a dew point, so that the water may condense and is formed on the elevated bonding layer 230. The elevated bonding layer 230 can stably exchange heat to the vapor, so as to condense the vapor to form the liquid layer 240 on the elevated bonding layer 230. In some embodiments, a gas is showered on the elevated bonding layer 230. In some embodiments, the gas showered on the elevated bonding layer 230 has a water vapor pressure higher than an ambient water vapor pressure, such that the liquid layer 240 can be formed on the elevated bonding layer 230 without adjusting the temperature of the elevated bonding layer 230. In some embodiments, the gas consists essentially of nitrogen and water.

Figure 2D:
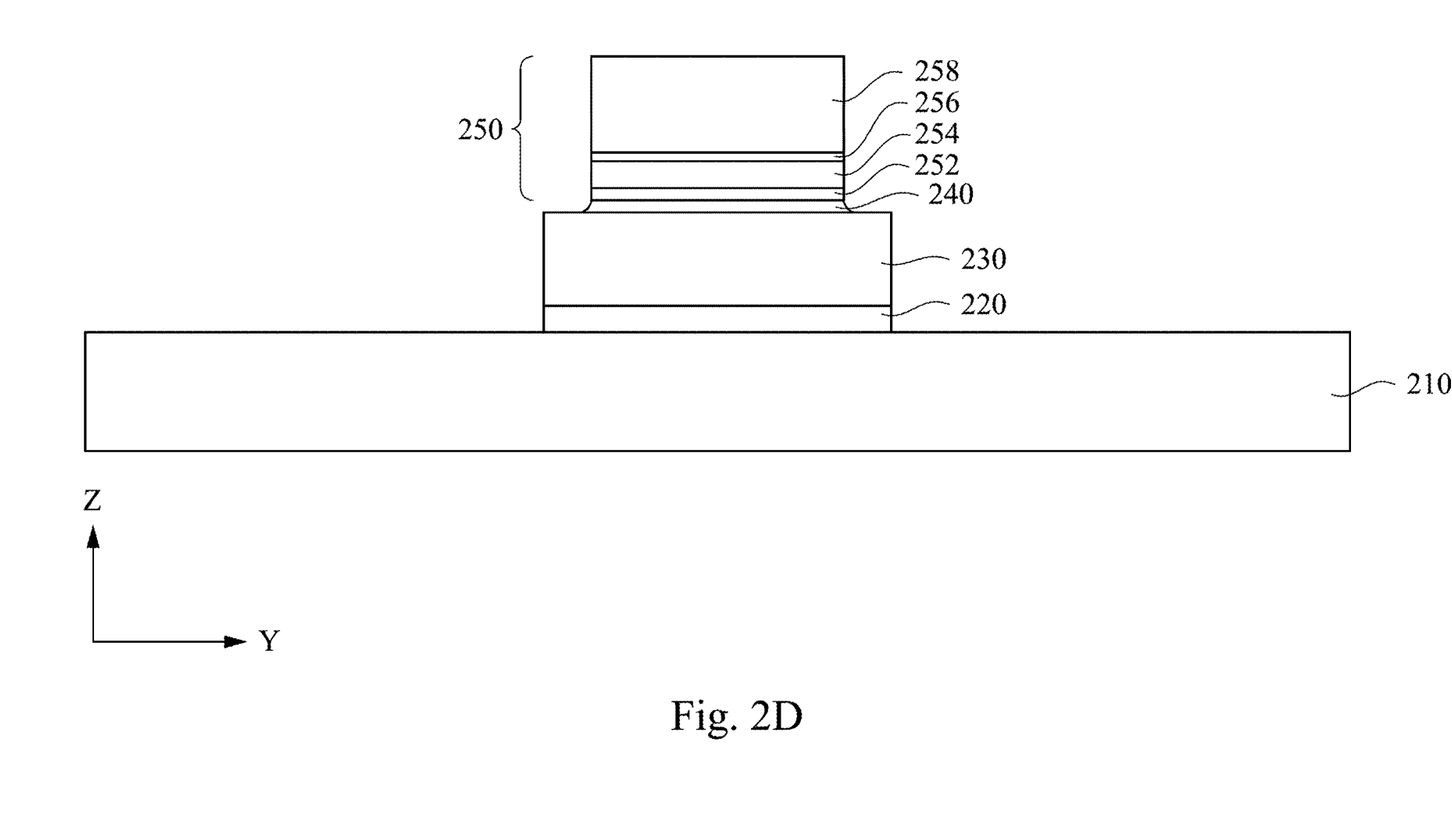
FIG. 2D is a schematic cross-sectional view of an intermediate stage of binding the micro device on the substrate according to some embodiments of the present disclosure.

Reference is made to FIG. 2D in which the micro device 250 is disposed over the elevated bonding layer 230. In some embodiments, when the micro device 250 is in contact with the liquid layer 240, the micro device 250 is gripped by a capillary force produced by the liquid layer 240 present between the micro device 250 and the elevated bonding layer 230. In some embodiments, a thickness of the liquid layer 240 between the micro device 250 and the elevated bonding layer 230 is smaller than a thickness of the micro device 250 when the micro device 250 is gripped by the capillary force, such that the micro device 250 can be gripped by the liquid layer 240 and can be substantially held in a position within a controllable region on the substrate 210. In some embodiments, the micro device 250 includes an electrode 252. The electrode 252 faces the elevated bonding layer 230. The electrode 252 may include Cu, but should not be limited thereto. The electrode 252 may also include an adhesive material such as chromium (Cr) or Titanium (Ti), but should not be limited thereto. In some embodiments, the thickness of the electrode 252 is smaller than or equal to 2 μm. In some embodiments, the thickness of the electrode 252 is smaller than or equal to about 0.5 μm, so as to prevent bending on a growth substrate and an epitaxial layer when the micro device 250 is fabricated before said disposition. In some embodiments, the micro device 250 includes a first type semiconductor layer 254, an active layer 256, and a second type semiconductor layer 258. The first type semiconductor layer 254 is in contact with the electrode 252. The active layer 256 is in contact with the first type semiconductor layer 254. The second type semiconductor layer 258 is joined with the first type semiconductor layer 254 through the active layer 256. The first type semiconductor layer 254 can be a p-type semiconductor layer, but should not be limited thereto. The second type semiconductor layer 258 can be an n-type semiconductor layer, but should not be limited thereto. In some other embodiments, the micro device 250 may also be a vertical type light-emitting diode, such as a vertical-cavity surface-emitting laser (VCSEL).

Figure 2E:
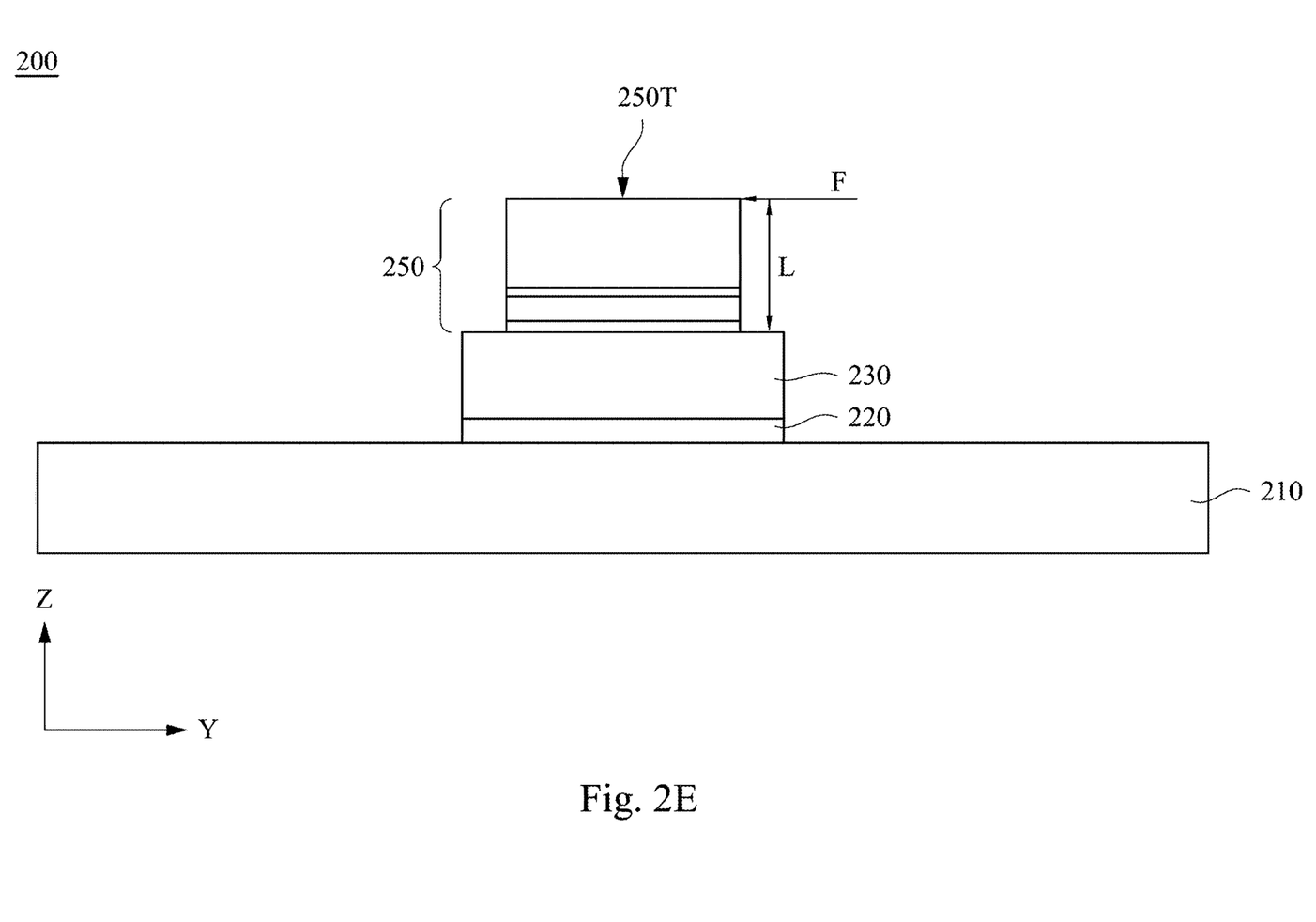
FIG. 2E is a schematic cross-sectional view of a final stage of binding the micro device on the substrate according to some embodiments of the present disclosure, in which a binding structure is formed after a liquid layer is evaporated.

Reference is made to FIG. 2E in which the liquid layer 240 is evaporated. After the liquid layer 240 as shown in FIG. 2D is evaporated, a binding structure 200 is formed as shown in FIG. 2E. The evaporation of the liquid layer 240 may be achieved by raising the temperature of the elevated bonding layer 230 such that the electrode 252 is stuck to the elevated bonding layer 230 after the liquid layer 240 is evaporated. The micro device 250 is now bound to and in electrical contact with the elevated bonding layer 230. The resulting binding structure 200 can prevent a possible damage due to a shear force F exerted on the micro device 250. To explain in more detail, as the shear force F is exerted on the micro device 250, such as exerted on a top surface 250T of the micro device 250 in a direction parallel to the Y direction, a torque to split the micro device 250 from the substrate 210 is generated and a value of the torque is the shear force F times a length L as exemplified in FIG. 2E. The length L is measured between a corner of the micro device 250 where the shear force F is applied to and an interface where the liquid layer 240 is evaporated (i.e., an interface between the electrode 252 and the elevated bonding layer 230). The method 100 for binding the micro device 250 on the substrate 210 as described in the embodiments mentioned above can shorten the length L due to that the elevated bonding layer 230 is pre-formed on the conductive pad 220 instead of being formed on the micro device 250. Therefore, the torque exerted on the micro device 250 generated by the shear force F as mentioned above can be reduced, and the binding structure 200 becomes more stable, so as to improve the yield of subsequent manufacture processes.

Figure 3:
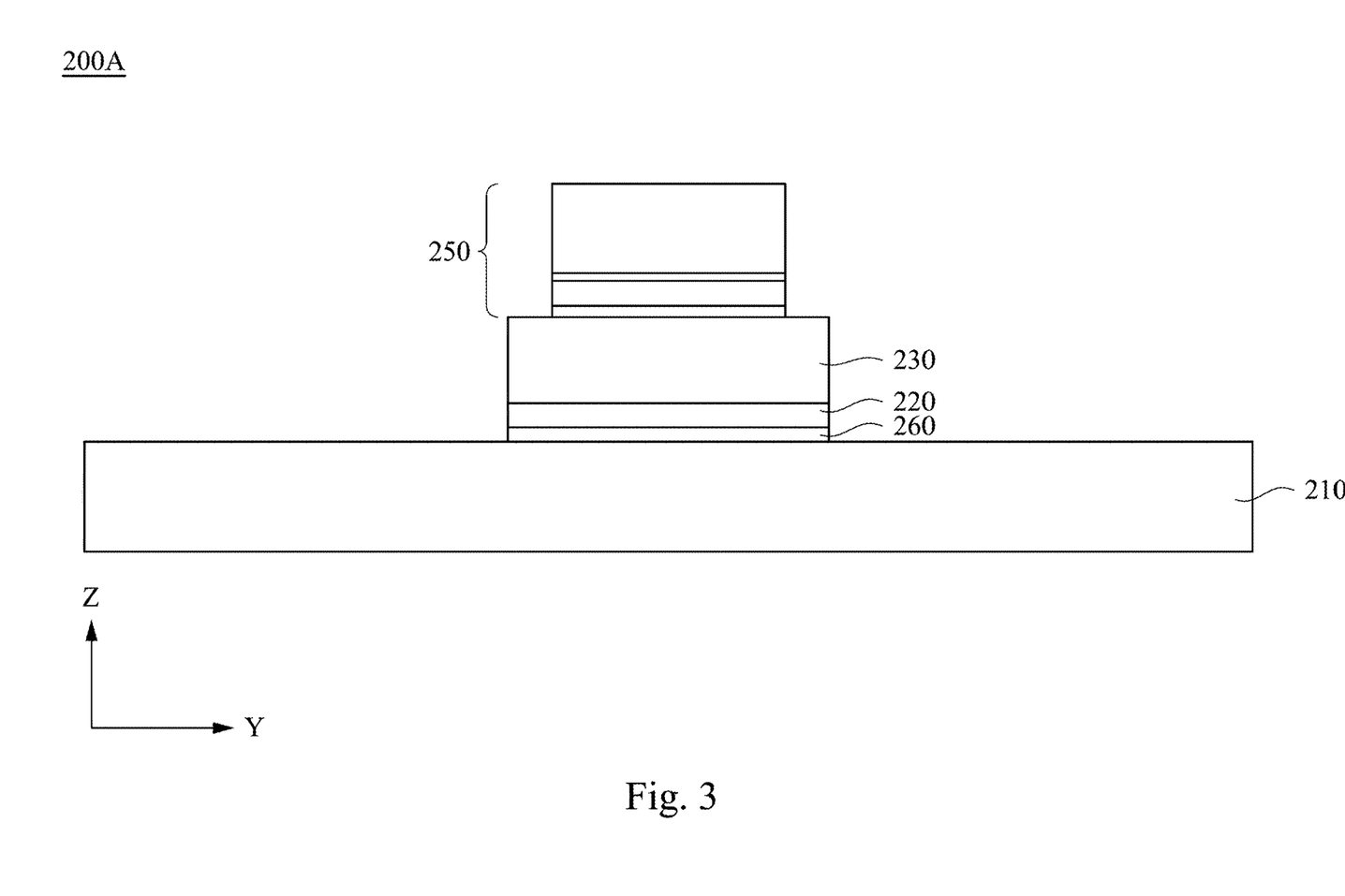
FIG. 3 is a schematic cross-sectional view of a binding structure according to some embodiments of the present disclosure.

Reference is made to FIG. 3. FIG. 3 is a schematic cross-sectional view of the binding structure 200A after the liquid layer 240 is evaporated. A difference between embodiments as illustrated by FIG. 3 and the embodiments as illustrated by FIGS. 2A to 2E is that in the embodiments as illustrated by FIG. 3, an adhesive layer 260 is formed on the substrate 210 before the conductive pad 220 is formed.

Figure 4:
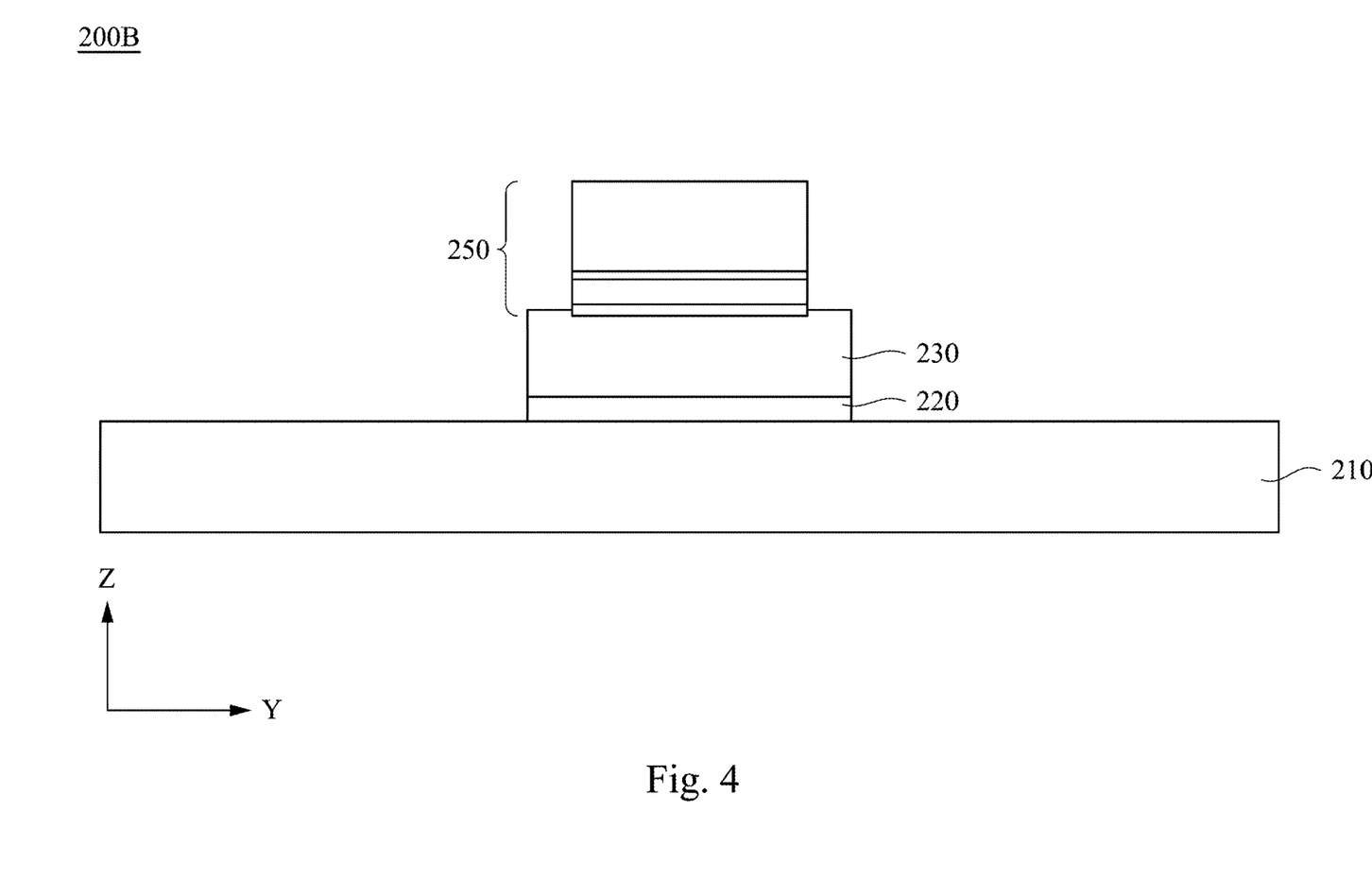
FIG. 4 is a schematic cross-sectional view of a bonding structure according to some embodiments of the present disclosure.

Reference is made to FIG. 4. FIG. 4 is a schematic cross-sectional view of the bonding structure 200B after the liquid layer 240 is evaporated. In some embodiments, after the liquid layer 240 is evaporated, the temperature of the elevated bonding layer 230 is further raised to be above a melting point of the elevated bonding layer 230. In some embodiments, after the liquid layer 240 is evaporated, the temperature of the elevated bonding layer 230 is further raised to be above a eutectic point of the elevated bonding layer 230 and the electrode 252 of the micro device 250. The bonding structure 200B in FIG. 4 shows a resulting structure after said raising of the temperature above said melting point and said eutectic point.

Figure 5:
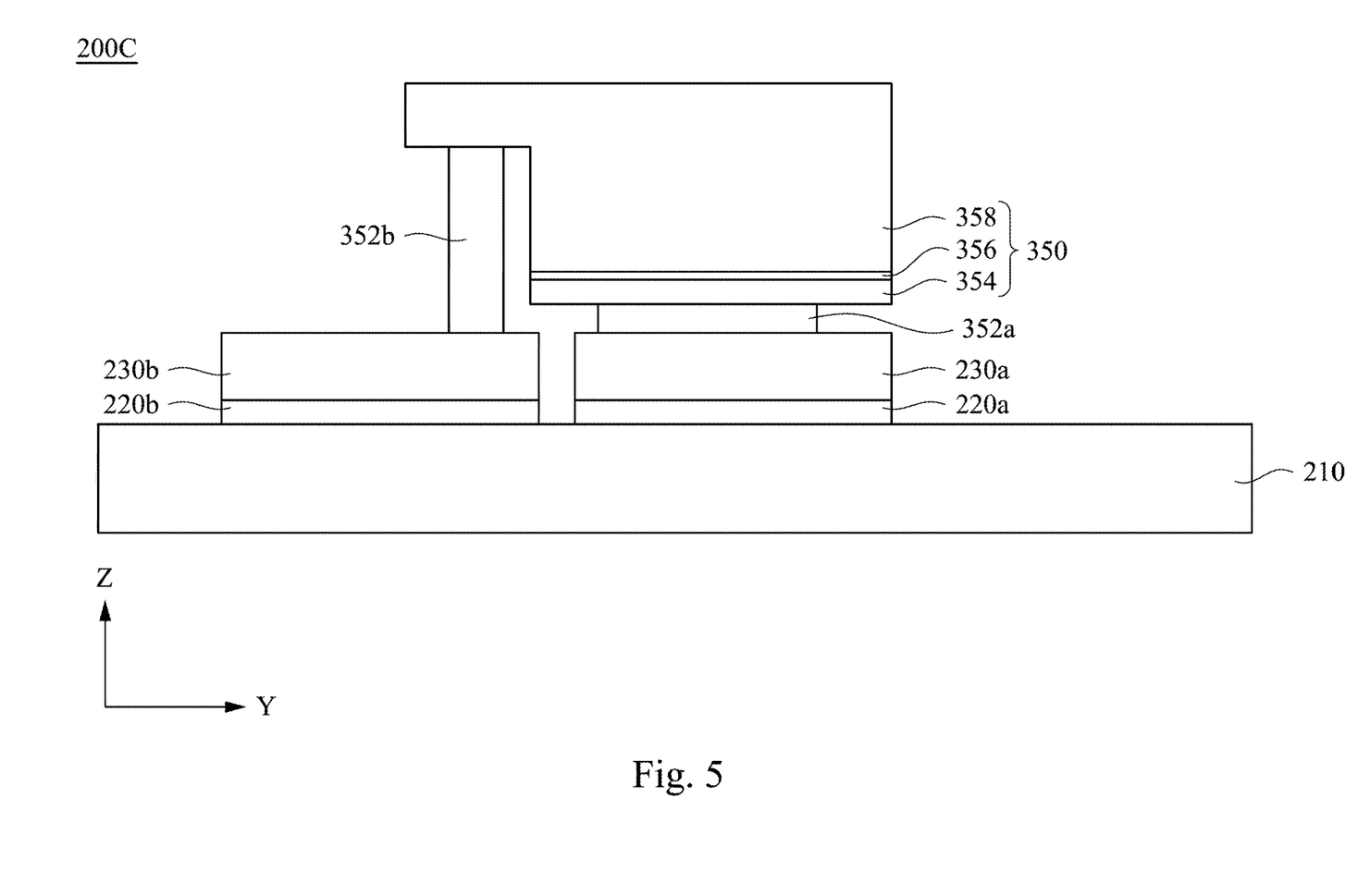
FIG. 5 is a schematic cross-sectional view of a binding structure according to some embodiments of the present disclosure.

Reference is made to FIG. 5. FIG. 5 is a schematic cross-sectional view of the binding structure 200C after the liquid layer 240 is evaporated. In some embodiments, the micro device 350 is a flip chip type light-emitting diode (LED). The flip chip type LED 350 includes a first type semiconductor layer 354, an active layer 356, a second type semiconductor layer 358, a first electrode 352a, and a second electrode 352b. The second type semiconductor layer 358 is joined with the first type semiconductor layer 354 through the active layer 356. The first electrode 352a is electrically connected to the first type semiconductor layer 354. The second electrode 352b is electrically connected to the second type semiconductor layer 358. Two individual conductive pads 220a and 220b are present on the substrate 210, and two individual elevated bonding layers 230a and 230b are respectively present on the conductive pads 220a and 220b. The conductive pads 220a and 220b are spaced apart from each other. The elevated bonding layers 230a and 230b are spaced apart from each other. In some embodiments, the first type semiconductor layer 354 is a p-type semiconductor layer, the second type semiconductor layer 358 is an n-type semiconductor layer, the conductive pad 220a is configured to receive the positive supply voltage, and the conductive pad 220b is configured to receive the ground voltage or the negative supply voltage. By performing a method similar to the method 100 shown in FIG. 1, the flip chip type LED 350 can be stuck to the elevated bonding layers 230a and 230b. In some embodiments, the electrodes 352a and 352b of the micro device 350 are substantially coplanar.

Figure 6:
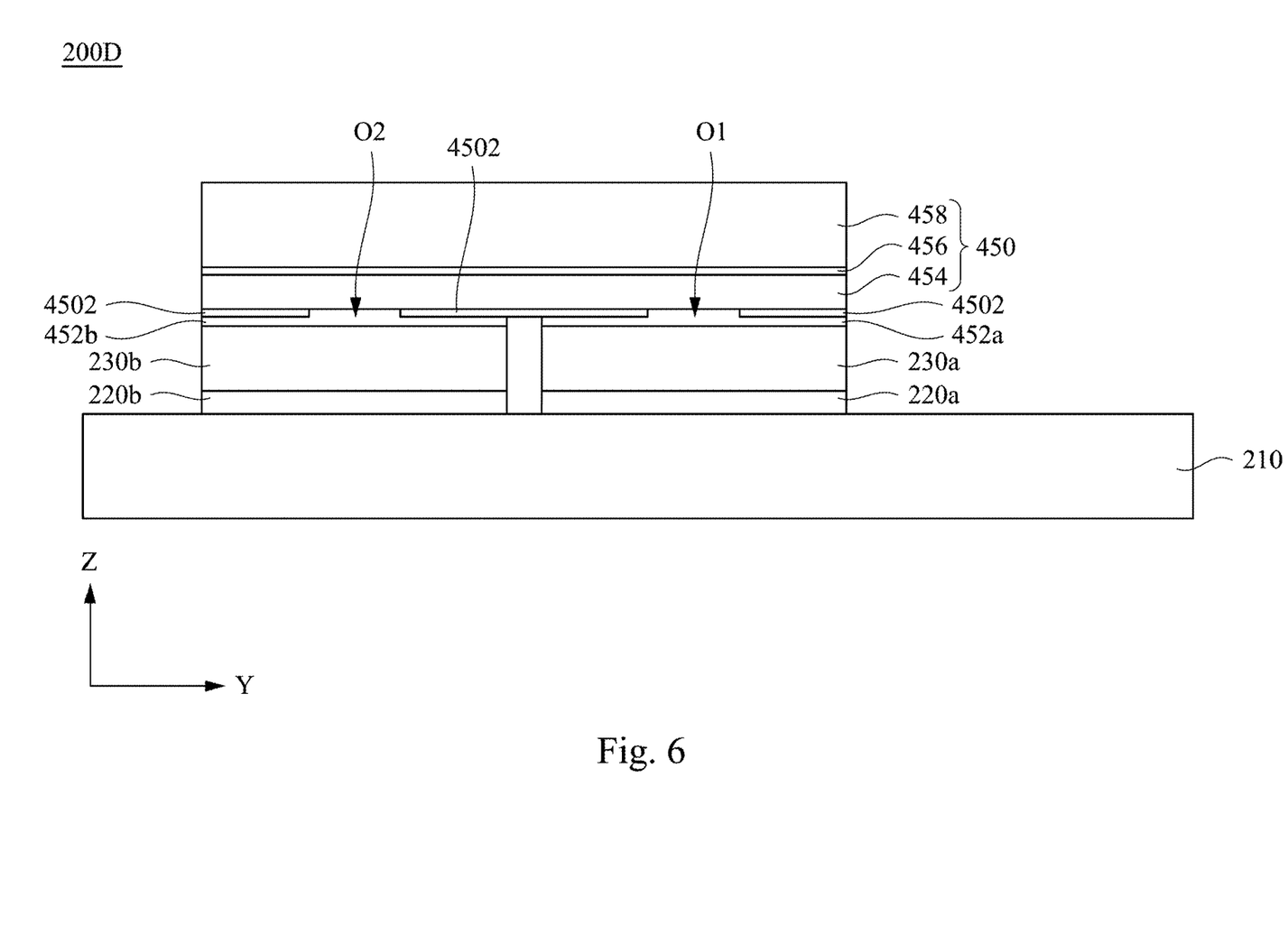
FIG. 6 is a schematic cross-sectional view of a binding structure according to some embodiments of the present disclosure.

Reference is made to FIG. 6. FIG. 6 is a schematic cross-sectional view of the binding structure 200D after the liquid layer 240 is evaporated. In some embodiments, the micro device 450 is a vertical type light-emitting diode (LED). The vertical type LED 450 includes a first type semiconductor layer 454, an active layer 456, a second type semiconductor layer 458, a current control layer 4502, a first electrode 452a, and a second electrode 452b. The second type semiconductor layer 458 is joined with the first type semiconductor layer 454 through the active layer 456. The current control layer 4502 is joined with the first type semiconductor layer 454. The current control layer 4502 has a first opening O1 and a second opening O2 therein. The first electrode 452a is electrically connected to the first type semiconductor layer 454 through the first opening O1. The second electrode 452b is electrically connected to the first type semiconductor layer 454 through the second opening O2. The substrate 210 has at least two individual conductive pads 220a and 220b. The conductive pads 220a and 220b are spaced apart from each other. In some embodiments, the conductive pad 220a is configured to receive a first voltage, and the conductive pad 220b is configured to receive a second voltage. The first voltage and the second voltage can be the same or different. By performing a method similar to the method 100 shown in FIG. 1, the first electrode 452a and the second electrode 452b can be respectively stuck to the elevated bonding layers 230a and 230b. Similarly, the first electrode 452a and the second electrode 452b can be respectively bound to the elevated bonding layers 230a and 230b.

In summary, a method for binding a micro device on a substrate is provided in some embodiments of the present disclosure in which an elevated bonding layer can prevent a possible damage caused by a shear force exerted on the micro device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for binding a micro device on a substrate, comprising:
    forming a conductive pad on the substrate;
    forming an elevated bonding layer on the conductive pad;
    adjusting a temperature of the elevated bonding layer to a selected temperature point in an environment comprising a vapor or showering a gas on the elevated bonding layer such that at least a portion of the vapor or the gas is condensed to form a liquid layer on the elevated bonding layer;
    disposing the micro device over the elevated bonding layer such that the micro device is in contact with the liquid layer and is gripped by a capillary force produced by the liquid layer between the micro device and the elevated bonding layer, wherein the micro device comprises an electrode facing the elevated bonding layer; and
    evaporating the liquid layer such that the electrode is bound to the elevated bonding layer and is in electrical connection with the conductive pad.

2. The method of claim 1, further comprising forming an adhesive layer on the substrate before forming the conductive pad.

3. The method of claim 1, wherein a thickness of the elevated bonding layer is in a range from about 1 μm to about 10 μm.

4. The method of claim 1, wherein the elevated bonding layer comprises tin.

5. The method of claim 1, wherein a thickness of the electrode is smaller than or equal to 2 μm.

6. The method of claim 1, wherein a thickness of the electrode is less than or equal to 0.5 μm.

7. The method of claim 1, wherein the liquid layer comprises water.

8. The method of claim 1, wherein the selected temperature point is a dew point.

9. The method of claim 1, wherein evaporating the liquid layer comprises raising a temperature of the elevated bonding layer such that the electrode is stuck to the elevated bonding layer after the liquid layer is evaporated.

10. The method of claim 1, further comprising raising a temperature of the elevated bonding layer to be above a melting point of the elevated bonding layer after evaporating the liquid layer.

11. The method of claim 1, further comprising raising a temperature of the elevated bonding layer to be above a eutectic point of the elevated bonding layer and the electrode after evaporating the liquid layer.

12. The method of claim 1, wherein a thickness of the liquid layer between the micro device and the elevated bonding layer is smaller than a thickness of the micro device when the micro device is gripped by the capillary force.

13. The method of claim 1, wherein the electrode comprises copper (Cu).

14. The method of claim 1, wherein the gas has a water vapor pressure higher than an ambient water vapor pressure.

15. The method of claim 14, wherein the gas consists essentially of nitrogen and water.

\* \* \* \* \*